United States Patent [19]

Houf et al.

[11] Patent Number: 4,769,557
[45] Date of Patent: Sep. 6, 1988

[54] MODULAR ELECTRIC LOAD CONTROLLER

[75] Inventors: Robert E. Houf, Glendale; Sydney W. Frey, Jr., Brookfield; Richard D. Marasch, Germantown; Edwin J. Wroblewski, Cudahy, all of Wis.

[73] Assignee: Allen-Bradley Company, Inc., Milwaukee, Wis.

[21] Appl. No.: 16,556

[22] Filed: Feb. 19, 1987

[51] Int. Cl.⁴ .............................................. H02J 3/00
[52] U.S. Cl. .................................. 307/147; 307/149; 361/383; 361/384; 361/388; 318/305
[58] Field of Search ............... 307/112, 147, 148, 40, 307/149; 361/23, 27, 342, 347, 348, 350, 353, 351, 363, 376, 383, 384, 386, 387, 388, 389, 392, 393, 394, 395, 412, 413, 110, 111, 112; 339/112 R; 200/289; 318/305

[56] References Cited

U.S. PATENT DOCUMENTS

| | | | |
|---|---|---|---|
| 4,020,359 | 4/1977 | Tate et al. | 307/40 |
| 4,177,499 | 12/1979 | Volkmann | 361/388 |
| 4,218,724 | 8/1980 | Kaufman | 361/395 |
| 4,288,830 | 9/1981 | Brasfield | 361/111 X |
| 4,291,364 | 9/1981 | Andros et al. | 361/384 |
| 4,322,767 | 3/1982 | Hamamsy et al. | 361/111 X |
| 4,399,486 | 8/1983 | Petsch | 361/383 X |
| 4,459,638 | 7/1984 | Brehm et al. | 361/384 |
| 4,470,092 | 9/1984 | Lombardi | 361/23 |
| 4,520,425 | 5/1985 | Ito | 361/384 |
| 4,557,225 | 12/1985 | Sagues et al. | 361/383 X |
| 4,593,342 | 6/1986 | Lindsay | 361/386 |
| 4,600,968 | 7/1986 | Sekiya et al. | 361/388 X |
| 4,620,263 | 10/1986 | Ito | 361/383 |
| 4,621,200 | 11/1986 | Lovrenich | 307/149 |
| 4,673,850 | 6/1987 | Maudlin | 318/305 |

FOREIGN PATENT DOCUMENTS 0042929  3/1985  Japan .............................. 307/132 E Primary Examiner—William M. Shoop, Jr.
Assistant Examiner—Paul Ip
Attorney, Agent, or Firm—Quarles & Brady

[57] ABSTRACT

An electric load controller having a modular construction with the logic circuitry located in an enclosure. This circuitry comprises a microprocessor, I/O interface and a memory for storing the computer program to be executed by the microprocessor. The control logic supplies signals via the I/O interface to a set of three modules which switch the three phase electric current to the load. The switch modules each having a separate enclosure containing thyristors which apply the electricity to the load in response to control logic signals. The switch modules are mounted on a heat sink and the logic circuit enclosure is mounted on the switch modules. A protection circuit module may be included that provides a metal oxide varistor and a capacitor connected across each phase of the electric power.

18 Claims, 3 Drawing Sheets

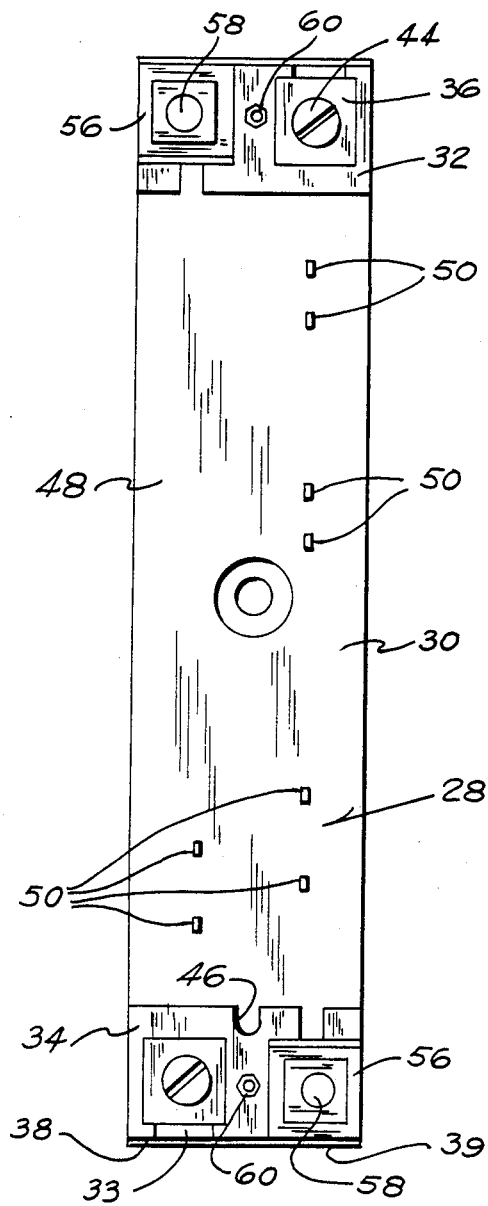
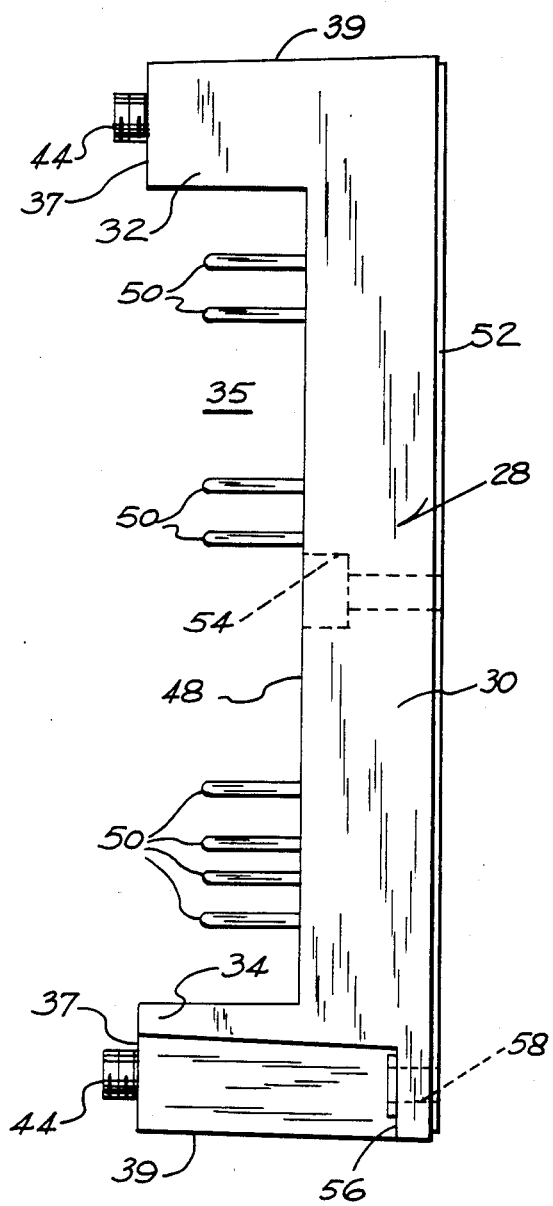
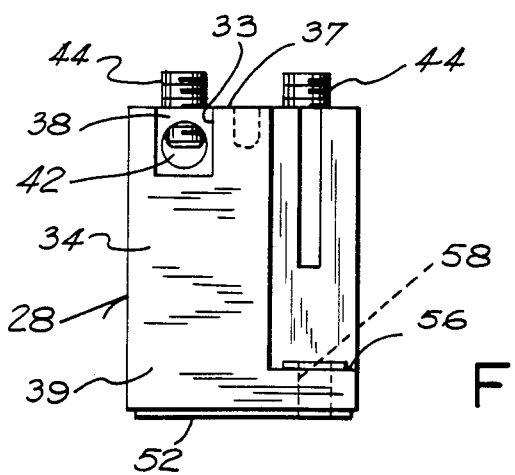

MODULAR ELECTRIC LOAD CONTROLLER

The present invention relates to electronic circuits for starting and controlling the operation of electric loads, such as motors, and in addition to enclosures for such circuits.

BACKGROUND OF THE INVENTION

When the full operating voltage is immediately applied to start an induction motor, the current during start-up can be six or more times the normal operating current. Therefore the power consumed during start-up may be considerable. In addition, the resulting starting torque can be three times normal, causing a decrease in the life of mechanical components, such as bearings, clutches and belts coupled to the motor.

Solid state motor controllers have been employed for sometime to start large electric induction motors. Many of these motors are three phase devices in which electric current for each phase must be switched in order to provide full motor control. Solid state motor controllers often provide a "soft start" in which the voltage applied to the motor is gradually increased, rather than applying the full operating voltage to the motor in a single step function. The soft start reduces the electrical current drawn by the motor during the starting and thereby reduces power consumption. Such controllers also sense fault conditions in the motor, such as a stall, and take measures to either correct the fault or to prevent damage to the motor.

In prior art systems, electronic logic circuits operated thyristors which controlled the electricity applied to the motor. All of the controller components were incorporated into a single housing to which the electrical power and the motor were connected. In providing a full line of controllers for motors of various sizes, i.e. different voltage and current ratings, various controllers having the same control logic sections but different types of thyristors had to be fabricated.

If these motor controllers failed in the field, typically because one or more of the thyristors burned out, the entire assembly, including the control electronics, had to be replaced. This dramatically increased the cost of such replacement. Furthermore, if the motor is replaced with one having a larger power rating, the controller may also have to be entirely replaced.

SUMMARY OF THE INVENTION

A modular electric load controller comprises an enclosure containing the control logic and having an external electrical connector. A separate module for switching each phase of the electrical current to the load is connected to the control logic enclosure. The switch module has its own enclosure with an electrical connector that mates with the electrical connector on the control logic enclosure. The switch module also has a power input terminal and a terminal for connecting the module to the load under control.

The modular design of the controller according to the present invention allows for replacement of a faulty electrical switch module without having to replace the electronics that control the switch module. In addition, the control electronics portion may be used with a variety of different power rated switch modules. The modular design also places the high voltage and heat generating components in a separate enclosure from the control logic circuits.

A further object satisfied by the present invention is to provide a compactly assembled device with different modules nesting with each other. The nesting permits the modules to electrically interconnect directly without having to use individual wires or cables.

When the various modules are assembled together, another object is to provide a controller which has all of the electrical terminals and metal parts shielded from accidental contact.

BRIEF DESCRIPTION OF THE DRAWINGS

FIGS. 3(a), (b) and (c) are plane views of a switch module contained in the FIG. 1 assembly;

DETAILED DESCRIPTION OF THE PREFERRED EMBODIMENT

Figure 1:
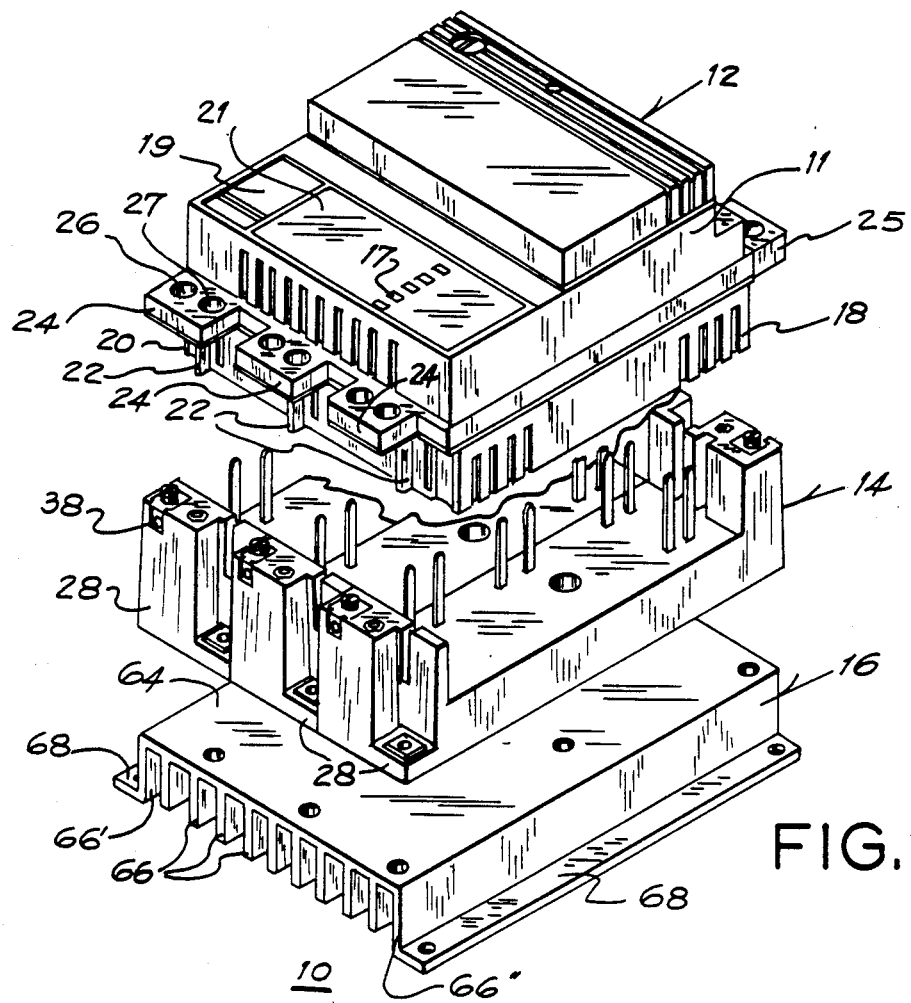
FIG. 1 is an exploded isometric view of the motor controller modules.
Figure 2:
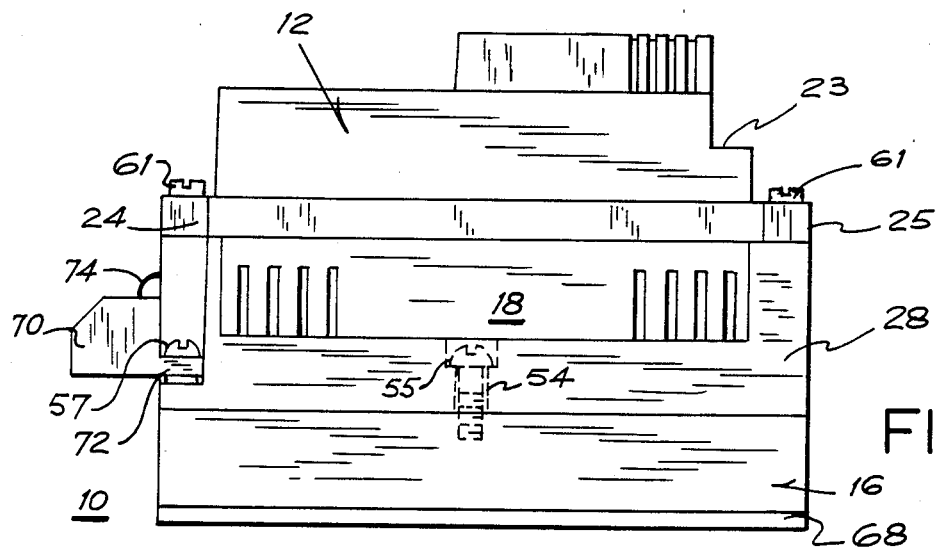
FIG. 2 is a side view of an assembled motor controller.

FIGS. 1 and 2 show a modular controller 10, for operating an electric load such as a motor. The controller 10 comprises a control logic module 12, electrical power switching assembly 14 and a heat sink 16. FIG. 1 shows the modules of the motor controller 10 in an exploded view from their assembled configuration shown in FIG. 2.

The control logic module 12 contains any of several well known electronic circuits for governing the operation of an electric motor in response to sensed operating conditions. The control logic module 12 consists of an enclosure 11 formed of an electrical insulating material and having a rectangular lower portion 18. One edge 20 of the rectangular lower portion 18 has a set of three elongated keys 22 extending vertically in the orientation of the controller in FIG. 1. Above the one edge 20 are three rectangular tabs 24 extending from the main body of the control module enclosure 11. Each tab 24 has two apertures 26 and 27 extending therethrough in the vertical direction.

Three additional tabs 25 extend from the rear surface of enclosure 11 and are similar to the tabs 24 on the front surface. A multi-conductor electrical connector 23 is located on the rear surface of the enclosure 11 (FIG. 2) to connect an operator control panel 88 (FIG. 5) or a programmable controller to module 12. The control logic module 12 receives control signals from the operator control panel 88 to start and stop the motor. An exposed major surface 21 of the control logic module enclosure 11 has status indicator lights 17 and a door 19 for access to system configuration switches. The bottom surface of the rectangular lower portion 18 has a number of apertures (not shown) which align with connectors on an electronic circuit board within the control logic module 12. Such apertures are adapted to receive mating connectors as will be described below.

The power switching assembly 14 consists of three identical switch modules 28 in separate enclosures made of an electrically non-conducting material, such as a plastic. The switch modules 28 are positioned side by side beneath the control logic module 12 and each of which controls one phase of the electric power for the motor (See FIG. 5). Alternatively, the present invention could be practiced by incorporating the switch module components into a single enclosure. One of these switch modules 28 is shown in the views of FIGS. 3. The switch module 28 consists of a base member 30 from which two legs 32 and 34 orthogonally extend to form a U-shaped structure with an interior opening 35. As shown in FIG. 2 the assembled controller 10 has the lower portion 18 of the control logic module 12 nested within this interior opening 35.

The inner surface 48 of the switch module's base number 30 has a number of electrical contact pins 50 extending therefrom. The electrical contact pins 50 are positioned on the base member 30 to mate with the apertures and terminals on the underside of the lower portion 18 of the control logic module 12. This mating connects the various control inputs and sensor outputs of the switch module 28 to the electronic circuit in the control logic module 12. When the controller 10 is assembled, as shown in FIG. 2, the pins 50 and their mating electrical terminals are fully shielded from external contact.

One of the legs 34 has a keyway 46 extending along the inner surface of the leg perpendicular to the base member 30. The keyway 46 is adapted to receive one of the keys 22 on the surface of the lower portion 18 of the control logic module 12 when the the control logic module is inserted into the central opening 35 of the U-shaped switch module 28, as in FIG. 2. The key 22 and keyway 46 prevent the otherwise symmetrical switch module 28 from being positioned onto the control logic module 12 in a reversed fashion. It is also noted with respect to FIG. 3(a) that the positions of the various electrical contact pins 50 form an asymmetrical pattern to further prevent the reverse positioning of the switch module. However, before the control logic module 12 contacts the pins 50 the key 22 must engage the keyway 46 at the upper end of leg 34 thereby protecting the pins from being bent when the modules are assembled incorrectly.

Figure 5:
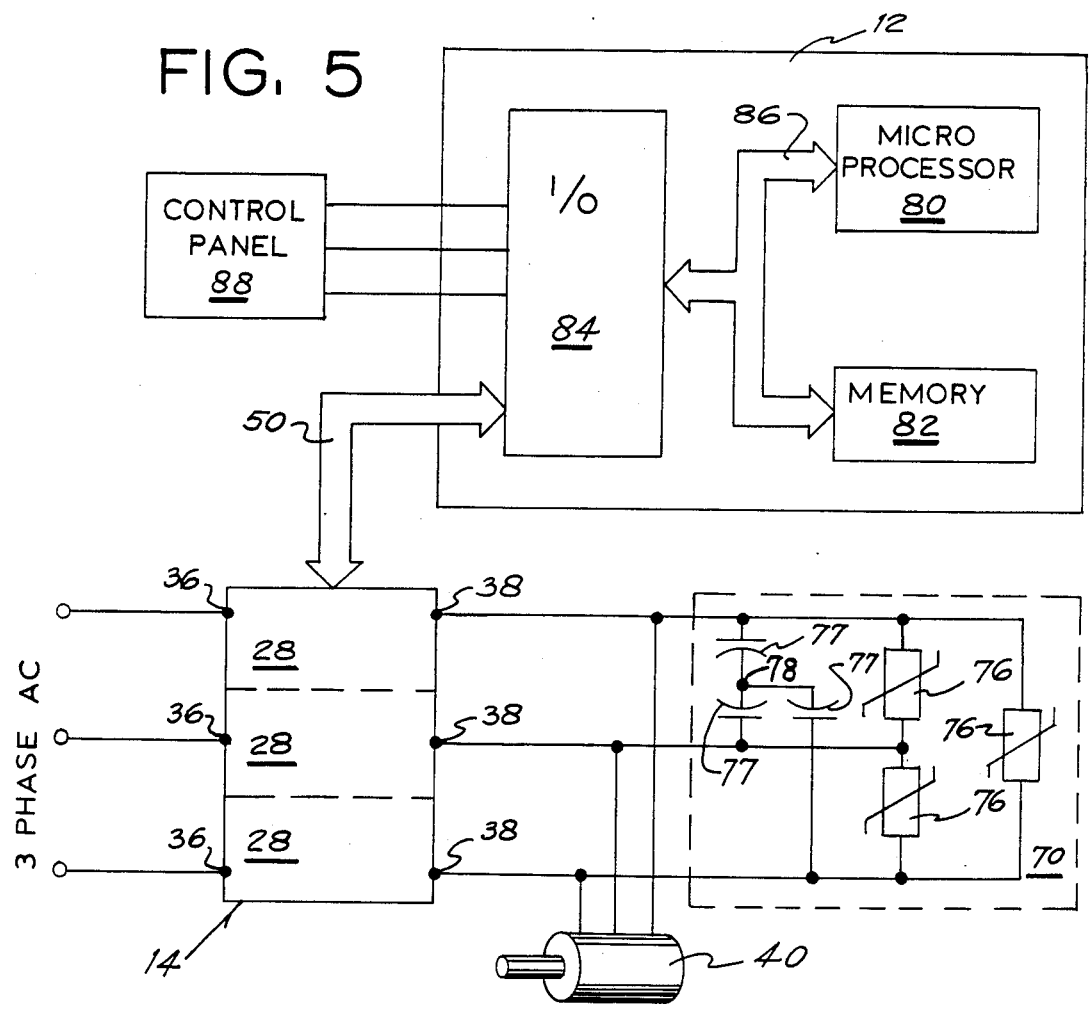
FIG. 5 is a electrical schematic diagram of the control module.

Both legs 32 and 34 are otherwise identical and include a metal electrical power terminal, 36 and 38 respectively, at the leg end 37 remote from the base member 30. Each terminal 36 and 38 has an aperture 42 extending into it from a recess 33 in the corresponding end 39 of the switch module 28. The recess 33 shields the terminals from accidental contact thereby protecting against electrical shorts and shocks. A set screw 44 extends into an aperture of each terminal 36 and 38 from the end 37 of the corresponding leg and communicates with the terminal aperture 42 so to clamp a wire that may be inserted into the terminal aperture. The first terminal 36 is the electric power input terminal and is to be connected to one phase of the source of electricity for the controlled motor. The other electrical terminal 38 is an output terminal of the controller 10 and is to be connected to the motor 40 as shown in FIG. 5.

The upper surface 37 of each leg 32 and 34 has a small threaded aperture 60 to receive a bolt 61 which extends through the apertures 27 in the rectangular tabs 24 and 25 of the control module 12 to fasten the control logic module enclosure 11 to each switch module 28. The other aperture 26 in the rectangular tab 24 and 25 is used to receive a screw driver to tighten and loosen the terminal set screw 44 when the switch module 28 is assembled onto the control logic module 12. The exposed end of terminal screw 44 is contained within aperture 26. In the assembled controller 10, the non-conductive tabs 24 and 25 shield the exposed metal parts of terminals 36 and 38 from accidental contact.

A metal heat sink contact plate 52 extends along the bottom surface of each switch module 28. The base member 30 has a countersunk aperture 54 extending from its inner surface 48 through the contact plate 52 for receiving a bolt 55 (FIG. 2) to fasten the switch module 28 to the heat sink 16. A recess 56 is located at one outer corner of each leg 32 and 34 near the junction with the base member 30. The bottom of each recess 56 has an aperture 58 extending therethrough to receive a bolt 57 for additional fastening of the switch module 28 to the heat sink 16. Locating the bolts 57 in recesses 56 remote from the terminals 36 and 38 decreases the likelihood of arcing between the two elements.

With reference to FIG. 1, the heat sink 16 may be formed of heavy gauge metal having a high thermal capacity. Although any of a number of types and configurations of heat sinks may be used, the present heat sink has a flat base plate 64 from which a plurality of fins 66 extend downward. The outer fins 66' and 66" have portions 68 extending orthogonally therefrom. Each of the orthogonally extending portions 68 have apertures therethrough for mounting the heat sink (and the entire modular motor controller 10) within an electrical control panel (not shown). Typically the controller 10 is mounted on a wall of the panel with the fins 66 extending vertically for optimum air flow between the fins. The base plate 64 has a number of apertures extending therethrough for receiving bolts 57 extending through apertures 58 in switch modules 28 to mount each of the switch modules to the heat sink 16. In order to provide good thermal conductivity between the switch modules 28 and the heat sink 16, thermal grease or a similar material is applied at the interface of the switch module contact plates 52 and the heat sink. For very large motors, the size of the heat sink 16 would have to be increased to dissipate more heat generated by its components.

By locating the power terminals 36 and 38 at the remote ends 37 of each leg 32 and 34, the exposed metal of the terminal and of the electric wire connected thereto are away from the heat sink 16 and its mounting bolts 57. This decreases the possibility of arcing. The electronic power switching circuit is compact enough to fit within the base member 30 of the switch module 28 enabling the base to be less high than the leg portions 32 and 34 of this module. The smaller central or base member 30 defines the U-shape of the switch module which allows for a compact nesting of the assembled controller 10 while still providing a separation of the electrical power terminals 36 and 38 from other conductive parts.

In FIG. 2, the motor controller 10 is assembled with an optional electrical transient protection module 70. The protection module has two mounting tabs 72 with apertures therethrough for fastening to the controller 10 by the bolts 57 that hold the switch modules 28 to the heat sink 16. Three leads 74 electrically connect the protection module 70 to the output terminals 38 of each switch module 28. Alternatively the protection module 70 may be connected to the input terminals 36 of the controller 10.

FIG. 5 shows a schematic representation of the processor for the control logic module 12. This procession includes a microprocessor 80 connected via an internal bus 86 to a memory 82. The memory stores the computer program instructions for governing the operation of the controller. Also connected to bus 86 is an input/output (I/O interface 84 which couples the external components to the circuitry in control logic module 12. Specifically, the interface 84 connects the control logic module to an operator control panel 88 containing manual switches, or to a programmable controller. The switching assembly 14 is also connected via pins 50 to the I/O interface 84. The I/O interface 84 includes circuitry for driving the SCRs in each switch module 28 and converting the sensed parameters (temperature, voltage and current) into signals for processing by the microprocessor 80. As is shown each phase of the three phase alternating current is connected to a separate module 28 of the switching assembly 14.

Each phase of the electric power is also coupled to the power transient protection module 70. The protection module 70 contains a metal oxide varistor (MOV) 76 connected across each phase of the power lines from the controller 10. Capacitors 77 also housed in the protection module extend from each power line to a common node 78.

Figure 4:
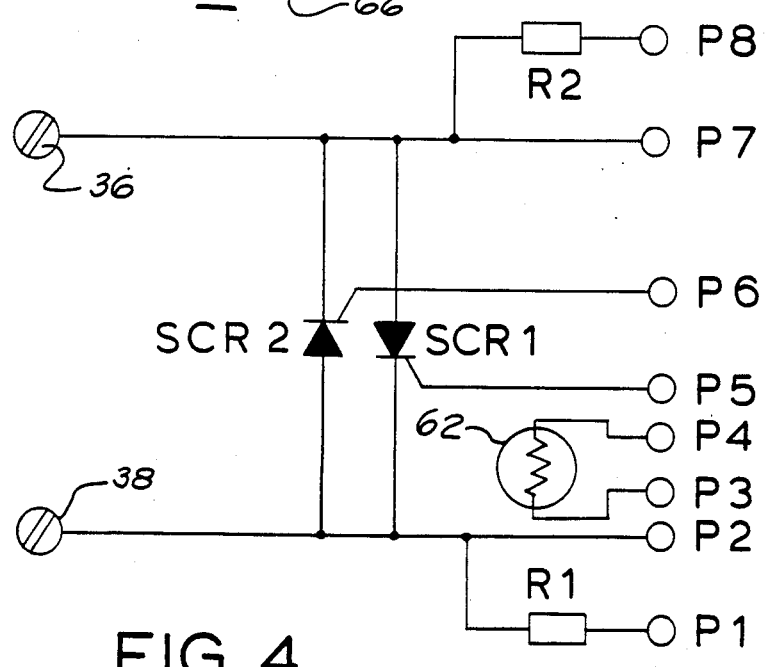
FIG. 4 is a schematic diagram of the electrical circuit for the switch module.

The circuitry contained within each switch module 28 is shown in FIG. 4 and consists of two silicon controlled rectifiers, SCR 1 and SCR 2, connected in opposite polarity between the input terminal 36 and the output terminal 38. The gate leads of the SCR's are connected to two contact pins 50 of the module 28 designated pins P5 and P6 in FIG. 4. Each of the SCR's is mounted in good thermal cortact on the heat sink contact plate 52. A temperature sensor, such as thermistor 62, is in thermal contact with one of the SCR's to provide an indication of the SCR's temperature to the logic module 12. The leads of the thermistor 62 are connected to additional electrical contact pins 50 of the module 28, in this case pins labeled P3 and P4. Other pins 50 are connected to other points of the switching circuit either directly or via sensing resistors R1 and R2 to provide signals to the control logic module 12 indicating the switch module's operation.

When the two SCR's are turned on by proper voltage levels applied to their gates, the alternating supply current is switched from the input terminal 36 to the output terminal 38 turning on the motor 40. Each of the three modules 28 is simultaneously controlled. When the motor 40 is started the SCR's are turned on for only a portion of each cycle of the input electric current. This portion is increased by the control logic until the SCR's are always on at which point the motor 40 has reached substantially full speed. This starting operation is well known and is carried out by previously available device controllers.

The modularity of the present invention reduces the expense of repairing or modifying a controller since only the specific component module needs to be replaced, rather than the entire controller as in previous controller designs. A common failure of the motor controllers in the field is the burning out of one or more thyristors (e.g. SCR1 or SCR2). Because of the modular enclosure configuration of the controller 10, when such a failure occurs the controller may be easily disassembled and the failed switching module or modules 28 may be replaced and the unit reassembled. Because of the modular construction, only the failed switching module 28, rather than the entire controller 10 or switching assembly 14 has to be replaced. In particular the control logic module 12 does not have to be replaced. If in another situation, the control logic module 12 is faulty, only it needs to be replaced. Similarly, in the event that a larger motor be used on the controlled equipment, the switch modules 28 may be replaced with ones having greater power handling capacity. In addition this modular design enables the control logic modules 12 to be manufactured as a separate unit for use with various sets of switch modules 28 to control motors of different power ratings.

The present modular construction provides a compact controller 10 in which the high voltage power terminals 36 and 38 are removed from proximity to the metal heat sink 16 and the surface on which the controller is mounted. The bolts 57 connecting the switch modules 28 to the heat sink 16 are located in recesses 56 away from the power terminals. The control logic module enclosure 11 has tabs 24 and 25 which electrically shield the exposed metal portions of the power terminals 36 and 38 while providing an aperture 26 through which the terminal set screw 44 may be adjusted to tighten or loosen the power conductor in the terminal without having to disassemble the controller 10.

Although the present invention has been primarily described for use with a controller for an electric motor, it has applicability to controllers for other types of electric loads.

We claim:
1. A modular controller for an electric load comprising:
a control module including an electronic logic circuit for controlling the operation of the electric load; and
a first switch module having first and second electric power terminals and having switch means for electrically connecting the first electrical power terminal to the second electric power terminal in response to a signal from said control module, said first switch module further having an enclosure with a base portion to which said control module abuts and with a first leg portion extending from said base portion, at least one of said electric power terminals located on the first leg portion.
2. The controller as in claim 1 wherein the switch module enclosure includes a second leg portion extending from said base portion, the other one of said electric power terminals being on said second leg portion.
3. The controller as in claim 2 wherein the base and leg portions form a U-shaped switch module enclosure.
4. The controller as in claim 3 wherein said control module is adapted to fit within the interior opening of the U-shaped switch module enclosure.
5. The controller as in claim 4 wherein one of said control module or said first switch module has a keyway and the other of said control module or said first switch module has a key located to fit within said keyway when said modules are assembled together.
6. The controller as in claim 1 wherein said control module further comprises a means for making electrical connection to the logic circuit; and said first switch module further comprises means for making electrical connection adapted to mate with the electrical connection means on said control module.
7. The controller as in claim 1 further comprising a heat sink in thermal conductive contact with the base portion of the switch module enclosure.
8. The controller as in claim 1 wherein each of said first and second power terminals has a set screw located in an aperture in one surface of the power terminal for fastening an electrical conductor to the power terminal; and wherein said control module has a set of tabs each of which covers the one surface of the first or second power terminals, said tabs having an aperture for re- ceiving the set screw of the corresponding power terminal.

9. The controller as recited in claim 1 further comprising second and third switch modules, each of said second and third switch modules including:
two electric power terminals;
switch means for electrically connecting said electric power terminals together in response to a signal from said control module; and
an enclosure having a base portion to which said control module abuts and a first leg portion extending from said base portion, at least one of said electrical power terminals located on the first leg portion.

10. The controller as in claim 9 further comprising a transient protection means connected to each switch module.

11. A modular controller for an electric load comprising:
a plurality of switch modules, each of said switch modules for controlling a different phase of the electricity to be supplied to the load and including: an enclosure having a base member from which two legs extend to form a U-shaped enclosure, an electric power input terminal on one of said legs, an electric power output terminal on the other of said legs, a switch means for electrically connecting said input terminal to said output terminal in response to a control signal, and a connector for applying said control signal to the switch means; and
a control logic module containing an electronic circuit for producing said control signal for each of said switch means, said control logic module having a portion which fits between the two legs of each of said plurality of switch modules, and having a connector means that mates with said connector of each of said switch modules.

12. The controller as in claim 11 further including a heat sink mounted in thermal contact with each of said switch modules.

13. The controller as in claim 12 wherein said enclosure of each of said switch modules has a thermally conductive surface in contact with said heat sink.

14. The controller as in claim 13 wherein the electronic circuit includes a microprocessor, an input/output interface for sending and receiving control signals to each switch module, and a memory for storing instructions which govern the operation of the controller.

15. The controller as in claim 13 wherein the input and output terminals are at an end of the respective leg on which the terminal is located; and further including a plurality of tabs on said control logic module which partially cover said terminals.

16. The switch module for a modular electric load controller which has a control logic module in an enclosure, and a separate switch module for each phase of the electricity to be controlled having a enclosure comprising:
a base member having means for making electrical contact to the switch module; and
two legs extending from said base member, each of said legs having an electrical terminal.

17. The switch module as in claim 16 wherein said two legs extend substantially orthogonally from said base member to form a U-shaped module adapted to receive the control logic module between said two legs.

18. The switch module as in claim 16 further including means to connect the switch module to a heat sink to provide thermal conductivity therebetween.

* * * * *